United States Patent [19]

Aito et al.

[11] Patent Number: 4,532,275

[45] Date of Patent: Jul. 30, 1985

[54] FIBER-REINFORCED COMPOSITE MATERIALS

[75] Inventors: Yuzo Aito; Keizo Shimada, both of Iwakuni, Japan

[73] Assignee: Teijin Limited, Osaka, Japan

[21] Appl. No.: 343,978

[22] Filed: Jan. 29, 1982

[30] Foreign Application Priority Data

Feb. 3, 1981 [JP] Japan ................................. 56-13735
Jun. 8, 1981 [JP] Japan ................................. 56-86819
Nov. 26, 1981 [JP] Japan ................................. 56-188305

[51] Int. Cl.³ .............................................. C08K 3/04
[52] U.S. Cl. .................................... 523/468; 523/400; 524/496; 525/420; 525/423; 428/367; 428/474.4; 428/902; 428/267; 428/287; 428/395
[58] Field of Search .................... 428/474.4, 267, 287, 428/395, 367, 902; 528/183; 524/496; 523/468, 400; 525/420, 423

[56] References Cited

U.S. PATENT DOCUMENTS

| | | | |
|---|---|---|---|
| 3,556,922 | 1/1971 | Green | 428/367 |
| 3,600,269 | 8/1971 | Daniels | 428/394 |
| 3,956,566 | 11/1976 | van Gils | 428/474 |
| 3,969,568 | 7/1976 | Sperley | 428/47 X |
| 4,075,172 | 2/1978 | Ozawa | 528/340 |
| 4,320,823 | 3/1982 | Covaleski | 428/902 |
| 4,413,114 | 11/1983 | Shimada | 528/183 |

*Primary Examiner*—Ellis P. Robinson
*Attorney, Agent, or Firm*—Sherman & Shalloway

[57] ABSTRACT

A fiber-reinforced composite material comprising a resin and 20 to 90% by weight, based on the composite material, of reinforcing fibers, said reinforcing fibers comprising fibers of a wholly aromatic polyamide consisting essentially of (1) structural units of the formula

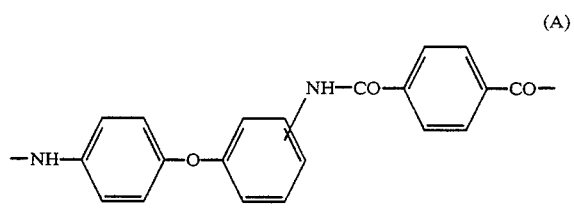

(A)

and (2) structural units of the formula

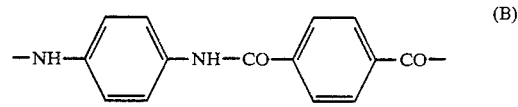

(B)

and/or structural units of the formula

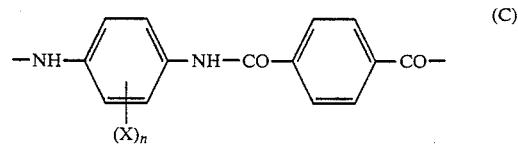

(C)

wherein X represents a halogen atom and n is an integer of from 1 to 3.

19 Claims, No Drawings

FIBER-REINFORCED COMPOSITE MATERIALS

This invention relates to a fiber-reinforced composite material containing fibers of a specified wholly aromatic polyamide as refinforcing fibers. More specifically, this invention pertains to a fiber-reinforced composite material having high strength, rigidity and impact strength and containing fibers of high tenacity and Young's modulus prepared from a specified wholly aromatic polyamide having diphenyl ether terephthalamide structural units as reinforcing fibers.

It has been known to use fibers of some wholly aromatic polyamides as a reinforcing material for fiber-reinforced composites.

For example, U.S. Pat. No. 3,287,324 discloses polymetaphenylene isophthalamides and fibers and films prepared therefrom, and states that reinforced plastic materials can be obtained by coating or impregnating fabrics made from the above fibers with a resin or mixing the fibers with a matrix resin.

U.S. Pat. No. 3,817,741 discloses high-molecular-weight polycarbonamides composed of recurring units of the following formula

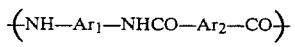  (1)

wherein $Ar_1$ and $Ar_2$ represent

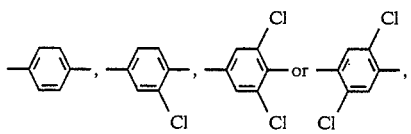

or a mixture thereof,
and fibers composed of these polymers, and states that these fibers are useful for production of reinforced plastic laminates.

The wholly aromatic polyamide fibers disclosed in the two U.S. patents, especially the latter, are characteristic in that they have high initial Young's modulus and high tenacity. This characteristic is common with the characteristic of carbon fibers which are extensively used as a reinforcing material. As is well known, composites including carbon fibers as a reinforcing material have the defect of poor impact strength. Investigations of the present inventors have shown that composite materials including fibers of the wholly aromatic polyamides disclosed in the above U.S. patents, for example poly(p-phenylene terephthalamide), as a reinforcing material are inferior in strength and rigidity to those including carbon fibers as a reinforcing material, but are characterized by having very high resistance to impact.

U.S. Pat. No. 4,075,172 discloses wholly aromatic polyamides consisting essentially of diamine recurring units of the formula

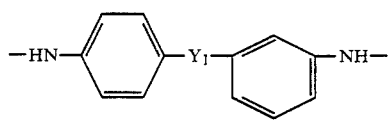  (1-A)

wherein $Y_1$ is at least one divalent moiety selected from the group consisting of —O—, —S—, —SO$_2$—, —CO—, —NH—, —CH$_2$ and —C(CH$_3$)$_2$— diamine recurring units of the formula

—NH—$Ar_1$—NH—  (1-B)

wherein $Ar_1$ represents a phenylene group, a naphthylene group, a biphenylene group or a group of the formula

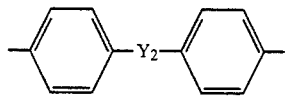

in which $Y_2$ has the same definition as $Y_1$ and is identical to, or different from, $Y_1$, all of which groups have their bond chains extending in a coaxial or parallel direction, and
dicarboxylic acid-type recurring units of the formula —OC—$Ar_2$—CO— wherein $Ar_2$ has the same definition as $Ar_1$ and is identical to, or different from, $Ar_1$,
the proportion of the diamine recurring units of formula (1-A) being 7.5 to 40 mole% based on the entire recurring units; and fibers and films prepared therefrom. The U.S. patent states that these fibers or films can be used as a reinforcing material. These fibers are also wholly aromatic polyamide fibers having high initial Young's modulus and tenacity, and may therefore be used as reinforcing materials, as can be seen from the disclosures of the two U.S. patents cited earlier in this specification. U.S. Pat. No. 4,075,172, however, neither describes nor suggests the properties of a composite material containing the fibers described there as a reinforcing material, having regard to the structure of the wholly aromatic polyamide disclosed there.

In recent years, there has been an increasing demand for the development of composite materials having high performance, especially high strength, rigidity and impact strength, in various industrial fields, for example those concerned with aircraft, railroad cars, motor vehicles, etc. Moreover, from the standpoint of saving resources and energy, higher levels of properties have been desired to be achieved.

It is an object of this invention therefore to provide a composite material of high performance having not only high strength and rigidity but also high impact resistance.

Another object of this invention is to provide a high-performance composite material having superior adhesion represented by high delamination shear strength and therefore exhibiting high strength, rigidity and impact resistance.

Still another object of this invention is to provide a high-performance composite material in sheet form having superior adhesion represented by high delamination shear strength and superior unidirectional tensile strength and flexural strength.

Further objects and advantages of this invention will become apparent from the following description.

These objects and advantages are achieved in accordance with this invention by a fiber-reinforced composite material comprising a resin and 20 to 90% by weight, based on the composite material, of reinforcing fibers, said reinforcing fibers comprising fibers of a wholly aromatic polyamide consisting essentially of (1) structural units of the formula

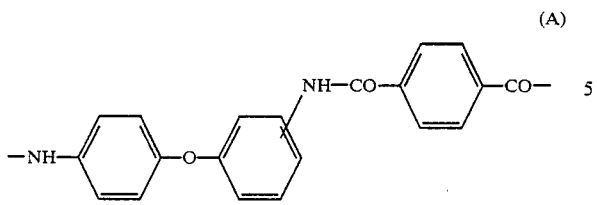

and (2) structural units of the formula

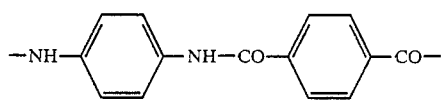

and/or structural units of the formula

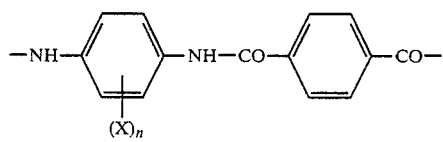

wherein X represents a halogen atom and n is an integer of from 1 to 3.

The fibers from the wholly aromatic polyamide used in this invention essentially contains the structural units of formula (A) and at least one of the structural units of formulae (B) and (C). In other words, the fibers used in this invention are prepared from a wholly aromatic polyamide whose acid component is terephthalic acid and whose diamine component is diaminodiphenyl ether and p-phenylenediamine and/or a halogenated p-phenylenediamine.

In formula (A), one of the amino groups of the diamino diphenyl ether component is bonded to the 4-position of one of the phenyl rings (the position of the phenyl ring to which oxygen is bonded is taken as the 1-position), and the other amino group may be bonded to the 2-, 3- or 4-position (similarly, the position of the phenyl ring to which oxygen is bonded is taken as the 1-position) of the other phenyl ring. According to this invention, fibers from the wholly aromatic polyamide which includes structural units of formula (A) having 3,4'-diaminodiphenyl ether as a diamine component, i.e. structural units of the following formula

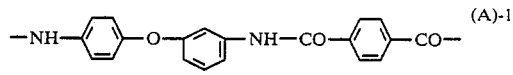

are preferred.

The structural units of formula (B) are self-explanatory from the formula, and will require no explanation.

In the structural units of formula (C), the halogen atom X in the halogenated p-phenylenediamine component includes, for example, chlorine and bromine, preferably chlorine. One to three (n) halogen atoms can be bonded to the phenyl ring. Preferably, the number of the halogen atoms X is one. Preferred fibers of the wholly aromatic polyamide having the structural units (C) are those containing the following structural units.

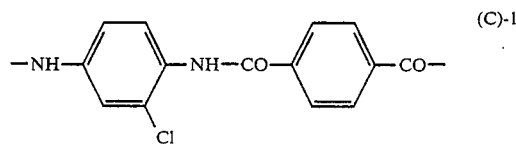

As is evident from the foregoing description, the fibers of wholly aromatic polyamides used in this invention include the following species.

(1) Fibers of a wholly aromatic polyamide consisting essentially of the structural units (A) and the structural units (B).

(2) Fibers of a wholly aromatic polyamide consisting essentially of the structural units (A) and the structural units (C).

(3) Fibers of a wholly aromatic polyamide consisting essentially of the structural units (A), the structural units (B) and the structural units (C).

The fibers (1) and (2) are preferred, and especially preferred wholly aromatic polyamide fibers for use in this invention are fibers of a wholly aromatic polyamide consisting essentially of the structural units of formula (A)-1 and the structural units of formula (B), or fibers of a wholly aromatic polyamide consisting essentially of the structural units of formula (A)-1, the structural units of formula (B) and the structural units of formula (C)-1.

Preferably, the fibers used in this invention are composed of a wholly aromatic polyamide consisting essentially of 5 to 95 mole% of the structural units of formula (A) [encompassing formula (A)-1], 0 to 95 mole% of the structural units of formula (B), and 0 to 95 mole% of the structural units of formula (C) [encompassing formula (C)-1], based on the entire units; and more preferably 15 to 50 mole% of the structural units of formula (A), 0 to 80 mole% of the structural units of formula (B), and 5 to 85 mole% of the structural units (C).

It has been found in accordance with this invention that the fibers of the wholly aromatic polyamide described above are a very suitable reinforcing material which gives the high-performance composite material of this invention having high adhesion to the matrix resin (represented by high delamination shear strength), high strength and high Young's modulus, as will be shown specifically by working examples given hereinbelow.

The wholly aromatic polyamide fibers used in this invention can be produced in accordance with the method described in U.S. Pat. No. 4,075,172 by, for example, polycondensing a diamine and terephthaloyl chloride in N-methylpyrrolidone containing calcium chloride, optionally filtering and deaerating the resulting polymer solution, and extruding the polymer solution into an aqueous coagulating agent through spinning nozzles (wet-spinning). According to this invention, there are preferably used fibers from a wholly aromatic polyamide having an inherent viscosity $[\eta_{inh}]$, determined at 30° C. for a solution of 0.5 g of the polymer in 100 ml of conc. sulfuric acid, of at least 1.5, preferably at least 2.5, and, especially those fibers having a tenacity of at least about 15 g/de and a Young's modulus of at least about 400 g/de.

The fiber-reinforced composite material of the invention is characterized by the fact that the specified wholly aromatic polyamide fibers are used as a reinforcing material. If desired, other reinforcing fibers may be used together with the wholly aromatic polyamide fibers. In this case, 10 to 90% by weight of the wholly aromatic polyamide fibers and 90 to 10% by weight of the other reinforcing fibers are used based on the entire reinforcing fibers; preferably, 20 to 70% by weight of the wholly aromatic polyamide fibers and 80 to 30% by weight of the other reinforcing fibers are used based on the entire reinforcing fibers. Examples of the other reinforcing fibers include carbon fibers, asbestos, glass fibers, and fibers of silica, silica alumina, potassium titanate, silicon carbide, silicon nitride, boron nitride and boron. The carbon fibers are preferred. Carbon fibers having a tenacity of at least 13 g/de, a Young's modulus of at least 1300 g/de and an elongation of at least 0.5% are especially preferred. The composite material of this invention when including carbon fibers as part of the reinforcing fibers tends to show higher strength and Young's modulus than the composite material of the invention including only the wholly aromatic polyamide fibers as the reinforcing fibers. Use of more than 90% by weight of carbon fibers is not recommendable because it reduces impact strength although it improves strength and Young's modulus.

The composite material of the invention may include the reinforcing fibers in the form of long or short fibers. These fibers may also be used in the form of a yarn composed of many filaments, a nonwoven fabric, or a fabric of plain weave, satin weave, twill weave, basket weave, etc.

The composite material of this invention consists essentially of the aforesaid reinforcing fibers and a resin, the proportion of the reinforcing fibers being 20 to 90% by weight. If the content of the reinforcing fibers exceeds the specified upper limit, the fixing of the reinforcing fibers in the composite material is not sufficient, and voids are liable to form. If, on the other hand, it is below the specified lower limit, a high-performance composite material having high strength, modulus and impact resistance in a well balanced combination cannot be obtained.

The reinforcing fibers are incorporated preferably in an amount of 30 to 85% by weight based on the weight of the composite material.

The resin forming the composite material of the invention may be a cured product of a curable resin, or a thermoplastic resin. Examples of the curable resin include epoxy resins, phenolic resins, polyimide resins, polyamideimide resins, silicone resins, polyurethan resins, alkyd resins, diallyl resins and unsaturated polyester resins. Preferred curable resins are those which are curable under heat. Examples of the thermoplastic resin are polyesters, polyamides, polyoxymethylene, polysulfone, polyether sulfone, and polyphenylene sulfide.

In an especially preferred embodiment, there is provided (a) a fiber-reinforced composite material composed essentially of a cured product of a thermocurable resin and 30 to 85% by weight, based on the composite material, of fibers of a wholly aromatic polyamide, said polyamide being composed of 20 to 60 mole% of the structural units of formula (A)-1 and 80 to 40 mole% of the structural units of formula (B), or (b) a fiber-reinforced composite material composed essentially of a cured product of a thermocurable resin and 30 to 85% by weight, based on the composite material, of fibers of a wholly aromatic polyamide, said polyamide being composed of 15 to 50 mole% of the structural units of formula (A)-1, 0 to 80 mole% of the structural units of formula (B) and 5 to 85 mole% of the structural units of formula (C)-1.

The fiber-reinforced composite material of this invention may be in the form of a sheet, or three-dimensional shaped articles suitable for ultimate uses. The sheet-like fiber-reinforced composite material can be advantageously produced by impregnating or coating a base material composed of the reinforcing fibers with the resin. The composite material in the form of a three-dimensional shaped article can be advantageously produced by mixing and kneading the reinforcing fibers with the matrix resin, or laminating them.

Such operations as impregnation, coating, mixing and lamination are known per se.

For example, the composite material of the invention in sheet form (planar article) can be produced by aligning a number of long fibers straightly in a plane or forming long fibers into a woven fabric or forming a number of long fibers into a nonwoven fabric by spreading or mixing them (in the case of using long fibers as the reinforcing material), or subjecting short fibers to frame spinning and then forming them into a fabric or mixing them into a nonwoven fabric (in the case of using short fibers as the reinforcing material); and in either case, applying the resin to the base material of the reinforcing fibers by coating or impregnation. The resin can be used in the form of a liquid, a solution, an emulsion, or a suspension, etc. The base material of reinforcing fibers may be dipped in it, or coated with it by spraying, hand-laying, or by means of various coaters such as a bar coater, a roll coater, a docter knife, etc.

It is also possible to coat a heat-softened liquefied resin directly on the base material (hot-melt type coating), or to superimpose a hot-melt type resin formed into a sheet in advance on the base material and heat the assembly thereby fixing (impregnating) the resin in the base material.

Furthermore, the composite material of this invention in the form of a three-dimensional shaped article suitable for ultimate usages (non-planar article) can be formed by impregnating or coating the reinforcing fiber material with the curable resin or thermoplastic resin in the same manner as above, and molding the resulting sheet-like material or a laminate of such sheet-like materials by a compression-molding method, for example by mechanically compressing it using a mold of a predetermined configuration, or applying the pressure of a gas to it in an autoclave. If, at this time, a thermosetting resin such as an epoxy resin or an unsaturated polyester resin is used as the matrix resin, it is possible to react the matrix resin impregnated in or coated on the base material of reinforcing fibers to an intermediate stage generally termed the B-stage to prepare a so-called prepreg and use it as the aforesaid sheet-like material or prepreg.

Alternatively, it is possible to mix and knead the matrix resin with the reinforcing fibers preferably in the form of short fibers, and shaping the mixture directly into a desired article, instead of first forming a sheet-like material. The molding may be performed by various methods such as spraying, hand lay-up, lamination, transfer molding, and injection molding in addition to the compression molding method mentioned above. These methods can be selected depending upon the form of the reinforcing fibers and/or the properties of the matrix resin.

If desired, the composite material of this invention may include additives such as fillers, pigments, fire retardants, light stabilizers, and antioxidants. Specific examples of these additives are calcium carbonate, calcium silicate, silica, alumina, carbon black, and titanium oxide.

The reinforcing fibers used in this invention may be combined with the resin after they have been subjected to a yarn-making process to convert them into a usually available form and optionally subjected to a drying treatment. Or before use, treating agents such as an oil and finishing agents used in the yarn-making process may be removed by extraction or the like. Or the fibers may be coated with a coupling agent, a surface modifying agent, or a resin such as an epoxy resin, before they are used to produce the composite material of the invention.

As shown above, the present invention can afford a composite material having high strength, high Young's modulus, light weight, and high impact strength at high levels in a well-balanced combination, and its industrial significance is very great.

The composite material of this invention can therefore be suitably used as an industrial material in various fields, for exampls in aircraft, railroad cars and motor vehicles. In addition, the sheet-like composite material is useful as various types of hoods, tents, or belt materials. Furthermore, by using suitable resins, the composite material of this invention may also be used as a shielding material for motors or power generators, or as an electrical insulating material as in printed boards.

The fiber-reinforced composite material of this invention will be described specifically by the following examples without any intention of limiting the invention thereby.

All parts in these examples are by weight. The various mechanical properties were measured by using molded articles having a thickness of 3 mm as samples unless otherwise specified. Flexural properties were measured with a span of 50 mm. Delamination shear strength was measured with a span of 15 mm. Izod impact strength (notched) was measured by using a test sample having the aforesaid thickness and a 45° V notch of a predetermined depth. Compression strength was measured by using a sample in the form of a prism having a width:length:height (in the direction of the fibers) ratio of 1:1:2. The inherent viscosity [$\eta_{inh}$] of a polymer is determined at 30° C. for a solution of the polymer in conc. sulfuric acid in a concentration of 0.5 g/dl.

The following Referential Examples illustrate the production of the wholly aromatic polyamide fibers used in the examples of the invention.

REFERENTIAL EXAMPLE 1

10.72 parts of 3,4'-diaminodiphenyl ether and 5.79 parts of p-phenylenediamine were dissolved in 500 parts of N-methyl-pyrrolidone in a stream of dry nitrogen. The solution was cooled to 0° C., and with vigorous stirring, 21.74 parts of terephthaloyl chloride powder was quickly added to polymerize the monomers. After the lapse of about 5 hours, calcium oxide was added to neutralize the by-product hydrochloric acid.

There was obtained a polymer having an inherent viscosity of 3.02 and a solution viscosity of about 500 poises at 100° C.

The neutralized solution was filtered, defoamed, and then spun by a semi-dry semi-wet method. The filaments were washed with water, dried, and hot-drawn over a hot plate heated at 500° C. The resulting multifilament yarn had a tenacity of 26.2 g/de, a Young's modulus of 630 g/de and an elongation of 3.9%.

REFERENTIAL EXAMPLE 2

7.186 parts of 3,4'-diaminodiphenyl ether and 11.942 parts of o-chloro-p-phenylenediamine were dissolved in 543.5 parts of N-methylpyrrolidone in a stream of dry nitrogen. The solution was kept at 20° C., and with vigorous stirring 24.310 parts of terephthaloyl chloride powder was added. Subsequently, the mixture was kept stirred while maintaining its temperature at 60° C. The viscosity of the mixture rose gradually to give a clear, highly viscous solution. One hour later, 8.74 parts of calcium hydroxide was added to neutralize the by-product hydrochloric acid. There was obtained a clear highly viscous solution.

A part of the solution was sampled and mixed with water. The precipitated polymer was separated, washed with water and dried. The resulting polymer had an inherent viscosity of 3.44.

The solution after the neutralization was filtered, defoamed, and spun by a semi-dry semi-wet method. The resulting filaments were fully washed with water in a multiplicity of washing baths, dried, and hot-drawn over a hot plate at 500° C. to give a multifilament yarn which had a tenacity of 28.0 g/de, a Young's modulus of 823 g/de and an elongation of 3.9%.

REFERENTIAL EXAMPLE 3

In a dry nitrogen atomosphere, 3.312 g of p-phenylenediamine, 5.824 g of o-chloro-p-phenylenediamine and 6.133 g of 3,4'-diaminodiphenyl ether were dissolved in 542.5 g of N-methyl-pyrrolidone, and 20.755 g of terephthaloyl chloride powder was added to the solution with stirring at room temperature. The viscosity of the solution gradually increased and a clear, highly viscous solution was obtained.

About 1 hour later, 7.46 g of powdery calcium hydroxide was added to the solution for neutralization. A clear, highly viscous solution was obtained.

A part of the solution was sampled and mixed with water, and the precipitated polymer was separated, washed with water and dried. The inherent viscosity of the polymer was found to be 3.04.

The solution after neutralization was spun by using a spinneret having 5 orifices each having a diameter of 0.3 mm in the same manner as described in Referential Example 1. The resulting filaments were drawn at a draw ratio of 14.3 on a hot plate maintained at 510° C. The resulting filaments had a total size of 9.1 denier, a strength of 22.0 g/de, a Young's modulus of 860 g/de, and an elongation of 3.0%.

EXAMPLE 1

The multifilaments obtained in Referential Example 1 were plied to form a yarn having a total size of 750 denier (500 filaments). The dried yarn was dipped in an epoxy resin solution consisting of 100 parts of an epoxy resin (Epikote 828, a trademark for a product of Shell Chemical Co.), 20 parts of a curing agent (Epicure Z, a trademark for a product of Shell Chemical Co.) and 12 parts of acetone, then squeezed through a fine hole so as to adjust the amount of the impregnated solution to a predetermined value, and wound up on a cylindrical drum by the filament winding method. Then, the impregnated yarn was maintained in a drying oven kept at 80° C. to convert the epoxy resin to the "B-stage" resin. In this way, a plurality of prepregs of the wholly aromatic polyamide yarns aligned in one direction (the matrix resin being the epoxy resin) were formed. Fifteen such prepregs were laminated in the same direction, and set in a mold kept at 120° C. The laminate was pressed first under a pressure of 80 kg/cm² and then under a pressure of 350 kg/cm², and thereafter maintained at 120° C. for 2 hours to form a wholly aromatic polyamide fiber/epoxy resin composite material. The density and typical properties of the composite material are shown in Table 1.

For comparison, a composite material was produced in the same way as in Example 1 except that a multifilament yarn of poly(p-phenylene terephthalamide) having a total size of 380 denier (267 filaments), an inherent viscosity of 3.5, a tenacity of 22 g/de, a Young's modulus of 950 g/de and an elongation of 24% was used instead of the wholly aromatic polyamide yarn used in the above procedure (Comparative Example 1).

TABLE 1

|  | Example 1 | Comparative Example 1 |
| --- | --- | --- |
| Reinforcing fibers (A) | Wholly aromatic polyamide fibers obtained in Referential Example 1 | Poly-(p-phenylene terephthalamide) fibers |
| Matrix resin (B) | Epikote 828/Epicure Z(100/20) | |
| A/B weight ratio | 50/50 | 50/50 |
| Density (g/cm³) | 1.29 | 1.32 |
| Flexural strength (kg/mm²) | 50.0 | 46.4 |
| Flexural modulus (kg/mm²) | 3000 | 3100 |
| Izod impact strength (notched; kg-cm/cm²) | 250 | 140 |
| Compression strength at 0° (kg/mm²) | 17.6 | 16.9 |
| Compression strength at 90° (kg/mm²) | 15.3 | 13.6 |
| Delamination shear strength (kg/mm²) | 5.3 | 5.2 |

EXAMPLE 2

The multifilaments of wholly aromatic polyamide obtained in Referential Example 1 were plied into a 300-denier yarn which was then woven into a fabric of plain weave (35/2.5 cm×35/2.5 cm) having a basis weight of 96 g/m².

The woven fabric was dried, and then dipped in the same epoxy resin solution as used in Example 1. The adhering solution was removed by passing the impregnated fabric between two rolls spaced from each other at a clearance of 0.2 mm. The fabric was then dried in the air and treated in a vapor dryer at 90° C. to form a prepreg. In this manner, a plurality of prepregs were formed.

Thirty such prepregs were pressed for 20 minutes under a pressure of 80 kg/cm² by means of a hot press maintained at 120° C. The pressed prepreg assembly was further maintained for 2 hours in a hot air dryer at 120° C. to form a laminated composite material. As is clearly seen from the results given in Table 2, this composite material showed excellent impact characteristics.

For comparison, a composite material was produced in the same way as in Example 1 except that a woven fabric of plain weave (27/2.5 cm×27/2.5 cm; basis weight 97 g/m²) made from the same poly(p-phenylene terephthalamide) yarn (380 de/267 filaments) as used in Comparative Example 1 was used (Comparative Example 2).

The results are shown in Table 2.

TABLE 2

|  | Example 2 | Comparative Example 2 |
| --- | --- | --- |
| Reinforcing fibers (A) | Wholly aromatic polyamide yarn produced in Referential Example 1 | Poly-(p-phenylene terephthalamide) yarn |
| Matrix resin (B) | Epikote 828/Epicure Z (150/20) | |
| A/B weight ratio | 60/40 | 60/40 |
| Density (g/cm³) | 1.30 | 1.33 |
| Flexural strength (kg/mm²) | 39.2 | 38.8 |
| Izod impact strength (notched; kg-cm/cm²) | 220 | 190 |
| Izod impact strength after boiling water treatment (kg-cm/cm²) (*) | 220 (100%) | 170 (89%) |

(*) The parenthesized figures are the percent retentions of the Izod impact strengths after the boiling water treatment. The boiling water treatment was effected in the following manner.
A test sample (12.5 mm wide, 125 mm long and 3 mm thick) was dipped in more than 50 times its weight of boiling water, and maintained in this state for 2 hours. Then, it was withdrawn and wiped with a dry cloth to remove the adhering water, after which the sample was tested for Izod impact strength.

EXAMPLE 3

Fifteen prepregs composed of the wholly aromatic polyamide yarns aligned in one direction as obtained in Example 1 were laminated, and pressed to form a composite material containing 60% by weight of the reinforcing fibers. The properties of the composite are shown in Table 3.

For comparison, a composite material was produced in the same way as above except the poly(p-phenylene terephthalamide) yarn used in Comparative Example 1 was used instead of the above wholly aromatic polyamide yarn (Comparative Example 3).

A composite material was obtained in the same way as in above except that one-way aligned prepregs of the epoxy resin type including carbon fibers (Besfight Prepreg Q-1112, a trademark for a product of Toho Beslon Co., Ltd.) were molded as above (Comparative Example 4).

The properties of the composites obtained in these comparative runs are also shown in Table 3. It is seen from Table 3 that the composite material of the wholly aromatic polyamide type in accordance with this invention has very good impact characteristics.

TABLE 3

|  | Example 3 | Comparative Example 3 | Comparative Example 4 |
| --- | --- | --- | --- |
| Reinforcing fibers (A) | Wholly aromatic polyamide yarn of Referential Example 1 | Poly(p-phenylene terephthalamide) yarn | Carbon fibers |
| Matrix resin (B) | Epikote 828/Epicure Z (150/20) | | Epoxy resin |
| A/B weight ratio | 60/40 | 60/40 | 60/40 |
| Density (g/cm³) | 1.30 | 1.32 | 1.51 |
| Flexural strength (kg/mm²) | 51.4 | 48.9 | 72.5 |
| Izod impact strength (notched; kg-cm/cm²) | 290 | 160 | 90 |

EXAMPLE 4

The same plain-weave fabric of wholly aromatic polyamide yarns used in Example 2 was impregnated with an epoxy resin solution composed of a mixture of 100 parts of Araldite LT 556 (a trademark for a product of Ciba-Geigy) and 32 parts of a curing agent (HY 932, a trademark for a product of Ciba-Geigy), and a laminate was produced by using a hot press kept at 140° C. The resulting laminate (30 ply, 3 mm thick) had a density of 1.30, a flexural strength of 42.5 kg/mm$^2$, a flexural modulus of 2800 kg/mm$^2$ and an Izod impact strength (notched) of 200 kg-cm/cm$^2$.

For comparison, a laminated composite was produced in the same way as above except that the same poly(p-phenylene terephthalamide) yarn as used in Comparative Example 2 was used instead of the polyamide fabric above. The resulting laminate composite had an Izod impact strength of 180 kg-cm/cm$^2$. (Comparative Example 5)

EXAMPLE 5

A yarn having a total size of 750 denier (500 filaments) was made by plying the multifilaments obtained in Referential Example 2. One-way aligned prepregs were prepared from the resulting yarn by the filament winding method in the same way as in Example 1.

Then, fifteen such prepregs were laminated, and pressed to form a composite material having a density of 1.29 and a fiber content of 55% by weight. The resulting composite material had an Izod impact strength (notched) of as high as 250 kg-cm/cm$^2$ and a tensile strength of as high as 145 kg/mm$^2$.

EXAMPLE 6

A multifilament yarn (1500 denier/1000 filaments) was prepared from the multifilaments of Referential Example 1 in the same way as in Referential Example 1. The resulting multifilament yarn was dried, and dipped in an epoxy resin solution consisting of 100 parts of an epoxy resin (Epikote 828), 20 parts of a curing agent (Epicure Z), 10 parts of a silane coupling agent (SH-6040, a product of Toray-Silicone Co., Ltd.), and 12 parts of acetone. The dipped yarn was passed through a small hole to remove the adhering solution, and maintained at room temperature for 60 minutes and then at 90° C. for 40 minutes to form a prepreg. In this way, a plurality of prepregs were produced.

Eleven such prepregs were laminated, and pressed by a press maintained at 160° C. under a pressure of 80 kg/cm$^2$ and then under a pressure of 390 kg/cm$^2$ to form a composite material.

The resulting composite material had a density of 1.28, a fiber content of 50% by weight, an Izod impact strength (notched) of 290 kg-cm/cm$^2$, a tensile strength of 140 kg/mm$^2$ and a delamination shear strength of 5.5 kg/mm$^2$.

EXAMPLE 7

A resin solution consisting of 100 parts of an unsaturated polyester resin (Upika 3464, a trademark for a product of Upika Company Ltd.) and 1.0 part by weight of tertiary butyl perbenzoate as a radical initiator was poured onto plain-weave fabrics of the wholly aromatic polyamide yarn used in Example 2 while laminating these fabrics to give a 27-ply laminate. The laminate was defoamed, pressed by a hot press at 120° C. for 1 minute under atmospheric pressure and then for 20 minutes under a pressure of 25 kg/cm$^2$. and then treated in a hot air dryer at 140° C. under atmospheric pressure for 2 hours to form a composite material.

The resulting composite material had a density of 1.30 and a fiber content of 70% by weight. The properties of the composite are shown in Table 4.

For comparison, the above procedure was repeated except that fibrics of poly(p-phenylene terephthalamide) (1140 denier/800 filaments; 17/2.5 cm × 17/2.5 cm) were used instead of of the above fabrics (Comparative Example 6).

The properties of the resulting comparative composite material are also shown in Table 4.

TABLE 4

|  | Example 7 | Comparative Example 6 |
|---|---|---|
| Reinforcing fibers (A) | Wholly aromatic polyamide yarn obtained in Referential Example 1 | Poly-(p-phenylene terephthalamide) fibers |
| Matrix resin (B) | Upika 3464/TBP (100/1) | |
| A/B weight ratio | 70/30 | 70/30 |
| Density (g/cm$^3$) | 1.30 | 1.33 |
| Flexural strength (kg/mm$^2$) | 25.1 | 23.5 |
| Flexural modulus (kg/mm$^2$) | 2050 | 2100 |
| Izod impact strength (notched; kg-cm/cm$^2$) | 220 | 160 |
| Delamination shear strength (kg/mm$^2$) | 2.0 | 1.8 |

EXAMPLE 8

The wholly aromatic polyamide multifilaments obtained in Referential Example 1 were cut to an average length of 3 mm, and then dried at 120° C. for 2 hours.

Twenty parts of the dried fibers and pre-dried polyethylene terephthalate chips were fed into an extruder heated at 280° C., and fully kneaded. The mixture was extruded into a rod form which was then cut to form pellets of the fiber-containing polyethylene terephthalate.

The resulting pellets were melted at 275° C. and extruded into a mold (kept at a temperature of 140° C.) to obtain a shaped article.

The properties of the shaped article are shown in Table 5. It showed excellent impact resistance characteristics.

For comparison, the above procedure was repeated except that poly(p-phenylene terephthalamide) fibers (Comparative Example 7) and poly(m-phenylene isophthalimide) fibers (Comparative Example 8) were used instead of the wholly aromatic polyamide fibers. The properties of the resulting shaped articles are also shown in Table 5.

TABLE 5

|  | Example 8 | Comparative Example 7 | Comparative Example 8 |
|---|---|---|---|
| Reinforcing fibers | Wholly aromatic polyamide yarn obtained in Referential Example 1 | Poly(p-phenylene terephthalamide) fibers | Poly-(m-phenylene isophthalamide) fibers |
| Fiber content (wt. %) | 20 | 20 | 20 |
| Density (g/cm$^3$) | 1.40 | 1.41 | 1.39 |
| Tensile strength (kg/mm$^2$) | 12.5 | 11.5 | 3.0 |
| Flexural strength (kg/mm$^2$) | 16.8 | 15.3 | 5.0 |
| Flexural modulus (kg/mm$^2$) | 750 | 820 | 400 |
| Flexural | 0.055 | 0.040 | 0.070 |

TABLE 5-continued

|  | Example 8 | Comparative Example 7 | Comparative Example 8 |
|---|---|---|---|
| deflection (−) | | | |
| Izod impact strength (kg-cm/cm$^2$) | 150 | 110 | 70 |

EXAMPLE 9

A plain-weave fabric (35/2.5 cm×35/2.5 cm) was produced by using the wholly aromatic polyamide multifilaments obtained in Referential Example 1. The fabric was dried in hot air at 120° C. for 2 hours, and then dipped in a polyurethane rubber resin (Ever-Grip 8174, a trademark for a product of Sale Tilney Company Ltd., Japan). The impregnated fabric was passed between two rolls set at a clearance of 250 microns, dried in the air and further dried for 3 hours in a vapor dryer kept at 96° C. (resin pick-up 146 g/m$^2$).

The resulting sheet material had a unidirectional tensile strength of 231 kg/2.5 cm and an elongation at break of 11%, thus showing very good dimensional stability and high strength.

The sheet material was cut to a width of 1.5 cm, and its breaking strength (cycles) was evaluated by using an MIT type break strength tester. The result was 15,900 cycles. At break, the sheet material was found to have a disturbed woven texture along the lines of bending, and broken fibers were detected.

COMPARATIVE EXAMPLE 9

A plain-weave fabric (basis weight 97 g/m$^2$) was produced in the same way as in Example 9 by using poly(p-phenylene terephthalamide) fibers (400 de/267 filaments, $\eta_{inh}=3.5$; tenacity 22 g/de; Young's modulus 490 g/de; elongation 3.7%) instead of the wholly aromatic polyamide fibers. The fabric was impregnated with the same polyurethan resin as in Example 9 (pickup 159 g/m$^2$) to produce a fiber-reinforced sheet material. The resulting sheet material had a unidirectional tensile strength of 210 kg/2.5 cm, an elongation at break of 13%, and a breaking strength by the MIT-type breaking strength tester of only 8400 cycles.

COMPARATIVE EXAMPLE 10

A plain-weave fabric (basis weight 120 g/cm$^2$) was produced from polyethylene terephthalate fibers. The fabric was impregnated with the same polyurethane resin as in Example 9. The resulting fiber-reinforced sheet material had a unidirectional tensile strength of as low as 48 kg/2.5, and an elongation at break of at least more than 30%, thus showing poor dimensional stability.

EXAMPLE 10

The N-methylpyrrolidone solution of wholly aromatic polyamide obtained in Referential Example 1 was spun by a semi-dry semi-wet method and drawn to form a yarn (1000 denier/500 filaments) having a tenacity of 25.0 g/de, a Young's modulus of 620 g/de and an elongation of 4.1%.

A plain-weave fabric (25/2.5 cm×25/2.5 cm; basis weight 217 g/m$^2$) was produced from the resulting yarn.

The fabric was dried in hot air at 120° C. for 2 hours, dipped in a resin solution consisting of 50 parts of Epikote 828, 50 parts of Epikote 871 (a trademark for a product of Shell Chemical Co.), 20 parts of a curing agent Epicure Z, and 50 parts of methyl ethyl ketone, squeezed between two rolls set at a clearance of 400 microns, and dried. The dried fabric was pre-heated at 95° C. for 30 minutes, and pressed by a press heated at 140° C. for 5 minutes under a pressure of 20 kg/cm$^2$ to form a fiber-reinforced sheet material (resin pick-up 308 g/m$^2$).

The resulting sheet material had a unidirectional tensile strength of as high as 515 kg/2.5 cm.

EXAMPLES 11 TO 13

The multifilament yarns obtained in Referential Example 1 were dried, and passed through an epoxy resin solution consisting of 100 parts of Epikote 828, 20 parts of Epicure Z and 12 parts of acetone, and then passed through a minute hole to adjust the amount of the solution impregnated in the yarns to a constant value, and wound up on a large-diameter cylindrical drum by the filament winding method. The wound-up yarns were then maintained in a drying oven kept at 90° C. to convert the epoxy resin to the "B-stage" resin and to form prepregs (I) of the one-way aligned type.

Separately, carbon yarns (600 denier/1000 filaments, a product of Toho Beslon Co., Ltd.) were impregnated with the same epoxy resin/curing agent solution as above in the same way as above to form one-way aligned type prepregs (II).

The prepregs (I) and the prepregs (II) were alternately laminated in each of the proportions shown in Table 6 in the resulting composite material so that the fiber content in the composite material reached about 60%. The properties of the resulting composites are shown in Table 6. It is seen that these properties were at a very high level, and the improvement of impact characteristics was especially remarkable.

For comparison, a composite material was produced in the same way as above except that only the prepregs (II) were used.

The conditions for the press-forming were as follows:
Main curing: 160° C., 80 kg/cm$^2$.G, 20 minutes
After curing: 160° C., 2 hours In Examples 14 to 17 and Comparative Examples 12 and 13, the same molding conditions as above were used.

TABLE 6

|  | Example 11 | Example 12 | Example 13 | Comparative Example 11 |
|---|---|---|---|---|
| Total fiber content | 67 | 66 | 66 | 69 |
| Carbon fibers/wholly aromatic polyamide fibers (weight ratio) | 79/21 | 56/44 | 25/75 | 100/0 |
| Density (g/cm$^3$) | 1.48 | 1.42 | 1.36 | 1.54 |
| Flexural strength (kg/mm$^2$) | 132 | 110 | 86 | 137 |
| Specific flexural strength (10$^6$ mm) | 89 | 77 | 63 | 89 |
| Izod impact strength (kg-cm/cm$^2$) | 165 | 205 | 246 | 120 |
| Flexural deflection (−) | 0.017 | 0.017 | 0.017 | 0.019 |
| Delamination shear strength (kg/mm$^2$) | 8.5 | 7.5 | 6.2 | 8.9 |

EXAMPLES 14 AND 15

The prepregs (I) of wholly aromatic polyamide fibers and the prepregs (II) of carbon fibers obtained in Example 11 were laminated in the carbon fibers/polyamide fiber weight ratios shown in Table 7 so that the total fiber content in the resulting composite reached 66% by weight, and hot-pressed. The properties of the resulting composite materials are shown in Table 7. It is seen from the table that the composite materials including the wholly aromatic polyamide fibers have higher impact strength and delamination shear strength than the composite material including poly(p-phenylene terephthalamide) fibers (Comparative Example 12).

TABLE 7

|  | Example 14 | Example 15 | Comparative Example 12 |
|---|---|---|---|
| Total fiber content (wt. %) | 66 | 66 | 66 |
| Carbon fibers/wholly aromatic polyamide fibers (weight ratio) | 38/62 | 23/77 | 23/77 |
| Density (g/cm$^3$) | 1.38 | 1.35 | 1.36 |
| Izod impact strength (kg-cm/cm$^2$) | 230 | 254 | 210 |
| Delamination shear strength (kg/mm$^2$) | 6.7 | 6.2 | 6.0 |

EXAMPLES 16 AND 17

The multifilament yarns (750 denier/500 filaments) of wholly aromatic polyamide obtained in Referential Example 2 were processed in the same way as in Example 11 and formed into one-way aligned type prepregs (III) by the filament winding method. The prepregs (III) so obtained and the prepregs (II) of carbon fibers obtained in Example 11 were laminated to form a composite material including carbon fibers and wholly aromatic polyamide fibers as reinforcing fibers.

TABLE 8

|  | Example 16 | Example 17 |
|---|---|---|
| Total fiber content (wt. %) | 66 | 63 |
| Carbon fibers/wholly aromatic polyamide fibers (weight ratio) | 56/44 | 0/100 |
| Flexural strength (kg/mm$^2$) | 112 | 58 |
| Flexural modulus (kg/mm$^2$) | 6660 | 3640 |
| Flexural deflection (−) | 0.016 | 0.057 |
| Izod impact strength (kg-cm/cm$^2$) | 195 | 260 |
| Delamination shear strength (kg/mm$^2$) | 7.8 | 4.8 |

EXAMPLE 18

The multifilament yarns (750 denier/500 filaments) of wholly aromatic polyamide obtained in Referential Example 1 and carbon yarns (600 denier/1000 filaments) used in Example 11 were simultaneously aligned, and passed through an epoxy resin solution consisting of 100 parts of Epikote 828, 100 parts of 4-methyltetrahydrophthalic anhydride (Rikacid MH, a trademark for a product of Shinnippon Rika K.K.), 1 part of benzyldimethylamine and 60 parts of acetone, further passed through a hook made of titania to control the pick-up, and then formed into prepregs (IV) by the filament winding method as in Example 11.

The prepregs (IV) were laminated, and pressed into a composite material having a total fiber content of 67% and a carbon fiber/wholly aromatic polyamide fiber weight ratio of 65/35. The resulting composite material had a delamination shear strength of as high as 7.9 kg/mm$^2$.

EXAMPLE 19

The wholly aromatic polyamide multifilaments obtained in Referential Example 3 were plied to form a yarn (450 denier/250 filaments). The dried yarn was dipped in a phenolic resin solution (a 50% methyl ethyl ketone solution of a phenolic resin "Cemedine #110", a trademark for a product of Cemedine Kogyo K. K.), and wound up by the filament winding method as in Example 1. The assembly was maintained in a drying oven kept at 80° C. to form phenolic resin-impregnated preprgs (one-way aligned type).

Twenty such prepregs were laminated, set in a mold heated at 120° C., and pressed under a pressure of 80 kg/cm$^2$. The pressure was then released, and the temperature was raised to 160° C. over the course of 30 minutes. Then, the assembly was further pressed under a pressure of 80 kg/cm$^2$.

The molded article was left to stand for 1 hour in a heating oven of the hor air circulating type maintained at 180° C. to complete the curing of the resin. The resulting article contained 60% by weight of the reinforcing fibers and had a density of 1.31 g/cm$^3$, a tensile strength of 135 kg/mm$^2$, a flexural strength of 54.5 kg/mm$^2$ and an Izod impact strength of 230 kg-cm/cm$^2$.

EXAMPLE 20

The multifilaments obtained in Referential Example 1 were plied to form a yarn (750 denier/500 filaments). The dried yarn was dipped in a polyamide resin solution (an N-methylpyrrolidone solution of BT Resin "BT 2170", a trademark for a product of Mitsuibishi Gas-Chemical Co., Ltd.) and processed in the same way as in Example 1 to form polyamide resin-impregnated prepregs by the filament winding method.

Fifteen such prepregs were laminated, set in a mold heated at 160° C., and pressed under a pressure of 100 kg/cm$^2$. The temperature was further raised to 220° C., and at this temperature the assembly was maintained under the same pressure for 3 hours. Then, the pressure was released, and the assembly was left to stand for 2 hours to form a composite material which had a density of 1.33 g/cm$^3$, a flexural strength of 43.5 kg/mm$^2$ and an Izod impact strength (notched) of 190 kg-cm/cm$^2$.

What we claim is:

1. A fiber-reinforced composite material comprising a resin and 20 to 90% by weight, based on the composite material, of reinforcing fibers, said reinforcing fibers comprising fibers of a wholly aromatic polyamide consisting essentially of (1) structural units of the formula

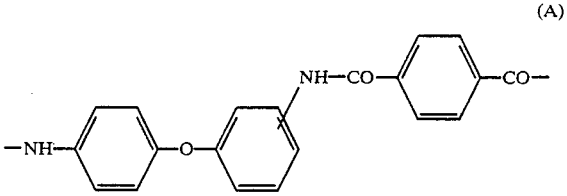

(A)

and (2) structural units of the formula

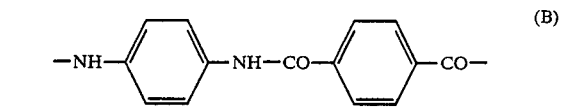

(B)

and/or structural units of the formula

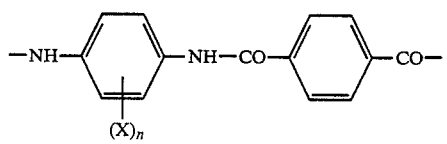 (C)

wherein X represents a halogen atom and n is an integer of from 1 to 3.

2. The composite material of claim 1 wherein the reinforcing fibers are substantially composed of the fibers of the wholly aromatic polyamide.

3. The composite material of claim 1 wherein the reinforcing fibers are composed substantially of said wholly aromatic polyamide fibers and carbon fibers.

4. The composite material of any one of claims 1 to 3 wherein said wholly aromatic polyamide consists substantially of the structural units of formula (A) and the structural units of formula (B).

5. The composite material of any one of claims 1, 2 or 3 wherein said wholly aromatic polyamide consists substantially of the structural units of formula (A), the structural units of formula (B) and the structural units of formula (C).

6. The composite material of claim 1 wherein the structural units of formula (A) are units represented by the following formula

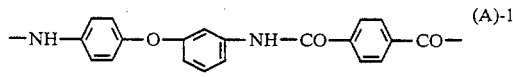 (A)-1

7. The composite material of claim 1 wherein in formula (C), X is a chlorine atom.

8. The composite material of claim 1 wherein said wholly aromatic polyamide consists of 5 to 95 mole% of the structural units of formula (A), 0 to 95 mole% of the structural units of formula (B) and 0 to 95 mole% of the structural units of formula (C).

9. The composite material of claim 3 wherein the reinforcing fibers are composed of 10 to 90% by weight of the wholly aromatic polyamide fibers and 90 to 10% by weight of the carbon fibers.

10. The composite material of claim 1 wherein the resin is a cured product of a curable resin.

11. The composite material of claim 10 wherein the curable resin is a thermocurable resin.

12. The composite material of claim 1 wherein the resin is a thermoplastic resin.

13. The composite material of claim 1 wherein the reinforcing fibers are long fibers.

14. The composite material of claim 1 wherein the reinforcing fibers are short fibers.

15. The composite material of claim 1 wherein the amount of the reinforcing fibers is 30 to 85% by weight based on the weight of the composite material.

16. The composite material of claim 1 which is in the form of a sheet.

17. The composite material of claim 1 which is in the form of a three-dimensional shaped article suitable for ultimate uses.

18. A fiber-reinforced composite material composed substantially of a cured product of a thermocurable resin and 30 to 85% by weight, based on the composite material, of fibers of an wholly aromatic polyamide, said wholly aromatic polyamide consisting of 20 to 60 mole% of structural units of the following formula

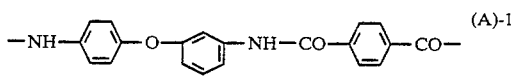 (A)-1 and 80 to 40 mole% of structural units of the following formula

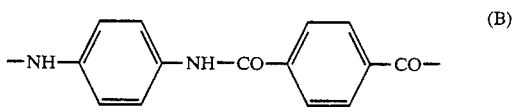 (B)

19. A fiber-reinforced composite material composed substantially of a cured product of a thermocurable resin and 30 to 85% by weight, based on the composite material, of fibers of a wholly aromatic polyamide, said wholly aromatic polyamide consisting of 15 to 50 mole% of structural units of the following formula

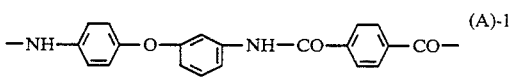 (A)-1

0 to 80 mole% of structural units of the following formula

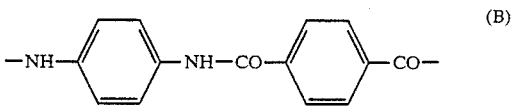 (B)

and 5 to 85 mole% of structural units of the following formula

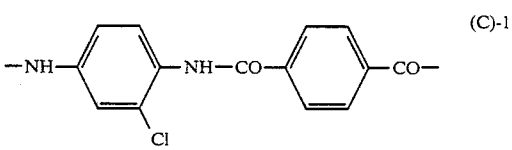 (C)-1

* * * * *